US011058026B1

(12) United States Patent
Marić et al.

(10) Patent No.: US 11,058,026 B1
(45) Date of Patent: Jul. 6, 2021

(54) AIR DEFLECTOR FOR COOLING SYSTEM IN A HEAD-MOUNTED DEVICE

(71) Applicant: Apple Inc., Cupertino, CA (US)

(72) Inventors: Ivan S. Marić, Sunnyvale, CA (US); Phil M. Hobson, Menlo Park, CA (US); Jan K. Quijalvo, Santa Clara, CA (US); Aidan N. Zimmerman, Sunnyvale, CA (US); Sivesh Selvakumar, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/809,470

(22) Filed: Mar. 4, 2020

Related U.S. Application Data

(60) Provisional application No. 62/836,290, filed on Apr. 19, 2019.

(51) Int. Cl.
H05K 7/20 (2006.01)
G06F 1/20 (2006.01)
G06F 1/16 (2006.01)

(52) U.S. Cl.
CPC ......... H05K 7/20145 (2013.01); G06F 1/163 (2013.01); G06F 1/1637 (2013.01); G06F 1/1656 (2013.01); G06F 1/203 (2013.01)

(58) Field of Classification Search
CPC ... H05K 7/20145; G06F 1/163; G06F 1/1656; G06F 1/203; G06F 1/1637
See application file for complete search history.

(56) References Cited

U.S. PATENT DOCUMENTS

| | | | | |
|---|---|---|---|---|
| 5,044,402 A * | 9/1991 | Haas | F24F 13/1426 137/875 |
| 6,181,557 B1 * | 1/2001 | Gatti | H05K 7/20618 165/122 |
| 6,629,523 B2 * | 10/2003 | Saltzman | F24C 15/20 126/110 A |
| 9,047,066 B2 * | 6/2015 | Mongia | G06F 1/203 |
| 9,175,873 B2 * | 11/2015 | Sheldon | F24F 13/1426 |
| 10,219,417 B2 * | 2/2019 | Juan | H05K 7/20972 |
| 10,261,555 B1 * | 4/2019 | Cooper | H05K 7/20972 |
| 10,405,467 B2 * | 9/2019 | McGinty | G06F 1/203 |
| 10,488,920 B2 * | 11/2019 | Lin | G06F 3/011 |
| 10,712,791 B1 * | 7/2020 | Stanley | G06F 1/1635 |
| 10,736,244 B1 * | 8/2020 | Lin | G02B 27/0176 |
| 2002/0181115 A1 * | 12/2002 | Massof | G02B 27/0172 359/630 |
| 2006/0081367 A1 * | 4/2006 | Chiu | F04D 25/0613 165/296 |
| 2010/0079356 A1 * | 4/2010 | Hoellwarth | G06F 3/041 345/8 |

(Continued)

Primary Examiner — Abhishek M Rathod
(74) Attorney, Agent, or Firm — Morgan, Lewis & Bockius LLP

(57) ABSTRACT

A head-mounted device includes a housing configured to be worn on a head of a user. The housing includes an inlet port and an outlet port. An air circulation device is mounted to the housing and configured to produce a flow of air through an air flow path in the housing that extends from the inlet port to the outlet port. A display assembly is mounted to the housing and has a surface in the air flow path of the housing. An air deflector mounted to the surface of the display assembly and configured to reduce a turbulence of the flow of air through the air flow path.

18 Claims, 5 Drawing Sheets

(56) References Cited

U.S. PATENT DOCUMENTS

| | | | |
|---|---|---|---|
| 2011/0162831 A1* | 7/2011 | Lee | H05K 7/20972 165/287 |
| 2011/0164382 A1* | 7/2011 | Pirillis | H01R 13/6586 361/690 |
| 2012/0327600 A1* | 12/2012 | Dunn | H05K 7/20209 361/695 |
| 2014/0085819 A1* | 3/2014 | Wang | H05K 7/20136 361/692 |
| 2014/0110090 A1* | 4/2014 | Ma | H01L 23/427 165/121 |
| 2015/0009625 A1* | 1/2015 | Chin | G02F 1/133382 361/695 |
| 2017/0083061 A1* | 3/2017 | Stellman | H01L 23/467 |
| 2017/0184863 A1* | 6/2017 | Balachandreswaran | G02B 27/0176 |
| 2018/0098465 A1* | 4/2018 | Reynolds | G02B 27/028 |
| 2018/0196485 A1* | 7/2018 | Cheng | G02B 27/0176 |
| 2018/0216850 A1* | 8/2018 | Lemon | F24H 9/0063 |
| 2018/0307282 A1* | 10/2018 | Allin | G06F 1/203 |
| 2019/0072772 A1* | 3/2019 | Poore | G06F 3/013 |
| 2019/0075689 A1* | 3/2019 | Selvakumar | G02B 27/017 |
| 2019/0079301 A1* | 3/2019 | Sauers | G02B 27/0176 |
| 2019/0191589 A1* | 6/2019 | Fitch | F28D 15/0241 |
| 2019/0331928 A1* | 10/2019 | Lin | G02C 11/08 |
| 2020/0073450 A1* | 3/2020 | Maric | G02B 27/0176 |
| 2020/0110449 A1* | 4/2020 | Chang | H05K 7/20172 |
| 2020/0400948 A1* | 12/2020 | Maric | G02C 9/02 |

\* cited by examiner

AIR DEFLECTOR FOR COOLING SYSTEM IN A HEAD-MOUNTED DEVICE

CROSS-REFERENCE TO RELATED APPLICATIONS

This application claims the benefit of U.S. Provisional Application No. 62/836,290, entitled "AIR DEFLECTOR FOR A COOLING SYSTEM IN A HEAD-MOUNTED DEVICE," filed Apr. 19, 2019, the entirety of which is incorporated herein by reference.

TECHNICAL FIELD

The described embodiments relate generally to cooling systems, and more particularly, to an air deflector for a cooling system in a head-mounted device.

BACKGROUND

A head-mounted device can be worn by a user to display visual information within the field of view of the user. The head-mounted device can be used as a virtual reality (VR) system, an augmented reality (AR) system, and/or a mixed reality (MR) system. A user may observe outputs provided by the head-mounted device, such as visual information provided on a display. The display can optionally allow a user to observe an environment outside of the head-mounted device. Other outputs provided by the head-mounted device can include speaker output and/or haptic feedback. A user may further interact with the head-mounted device by providing inputs for processing by one or more components of the head-mounted device. For example, the user can provide tactile inputs, voice commands, and other inputs while the device is mounted to the user's head.

BRIEF DESCRIPTION OF THE DRAWINGS

Certain features of the subject technology are set forth in the appended claims. However, for purpose of explanation, several embodiments of the subject technology are set forth in the following figures.

DETAILED DESCRIPTION

Figure 1:
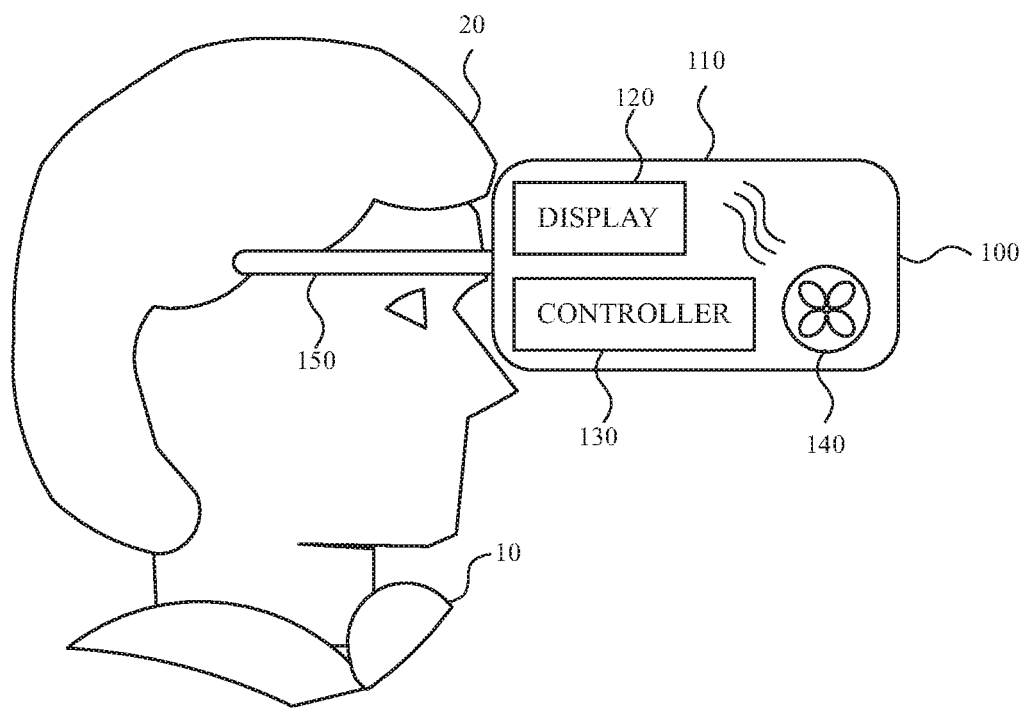
FIG. 1 illustrates a schematic diagram of an example of a head-mounted device.

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced without these specific details. In some instances, well-known structures and components are shown in block diagram form in order to avoid obscuring the concepts of the subject technology.

Head-mounted devices are an attractive technology for providing an immersive user experience. For example, head-mounted devices are gaining increased popularity for providing VR, AR, and MR experiences for applications such as gaming, movies, or simulations for professional training, among other potential applications.

Head-mounted devices can employ a wearable device housing that is secured to a user's head, and various electronic components within the housing, such as displays, integrated circuits, memory, audio devices, or electronic circuitry. As with other electronic devices, head-mounted devices can employ a cooling system based on circulation of air to maintain electronic components at desirable operating temperatures. The cooling system can also be used to cool the user's face from heat build-up inside the head-mounted device.

Maintaining efficient operation without unduly detracting from the user experience is a challenging task for head-mounted devices. The shape of the head-mounted device or layout of internal components can lead to a tortuous flow path for the cooling system. The proximity of the air flow path to the user's head can create undesired effects that detract from the user experience, such as excessive noise that interferes with the audio of the device in a noticeable manner. Some head-mounted devices may employ movable components that can interrupt the air flow path, such as adjustable optics that can be moved to account for a given user's interpupillary distance (IPD). IPD is defined as the distance between the centers of the pupils of a user's eyes. This adjustability can in turn make it difficult to design a cooling system in a given device that is suitable for different users.

According to some embodiments disclosed herein, a cooling system for a head-mounted device may employ an air deflector designed to affect a flow of air within the head-mounted device. The air deflector may be positioned in an air flow path extending through the housing of the head-mounted device, and can be designed to reduce the turbulence of air in the cooling system. For example, the air deflector can be positioned between a surface of an internal component and an incoming stream of air, at a reduced angle relative to the surface of the internal component so as to create smooth or more laminar flow over or across the component. The air deflector can be mounted to a movable component, such as an adjustable display assembly, so as to affect the flow of air as the moveable component is adjusted for particular users in a manner that results in a partial occlusion of the air flow path by the movable component. The air deflector can be configured to pivot or otherwise move to account for changes in the incident angle of air resulting from changes in the position of movable components. The air deflector can include or be coupled to additional thermal structures to enhance heat transfer affects resulting from the flow of air over the air deflector. For example, the air deflector can include an integrated heat sink and/or be coupled to heat-generating components via a thermally conductive interface material to enhance dissipation of heat from such components.

These and other embodiments are discussed below with reference to FIGS. 1-9. However, those skilled in the art will readily appreciate that the detailed description given herein with respect to these Figures is for explanatory purposes only and should not be construed as limiting.

FIG. 1 illustrates an example of a head-mounted device 100 secured to a head 20 of a user 10. As seen in FIG. 1, the head-mounted device 100 can include a housing 110 that is securable to the user's head 20 via a securement element 150. The securement element 150 can include a band, a strap, a rim, temples of a glasses frame, or any other suitable mechanism that serves to secure and retain the housing 110 on the head 20 of the user 10. The securement element 150 can be an integral part of the housing 110 or be implemented as a separate component attached thereto. The housing 110 can further include or be coupled to one or more nose pads that serve to rest the housing 110 on the nose of the user 10.

The housing 110 can enclose and support various functional components therein, such as integrated circuits, memory devices, processors, electronic circuitry, input/output devices, or other electronic components. In FIG. 1, housing 110 is shown as containing a display 120, a controller 130, and an air circulation device 140 therein. The display 120 can be positioned in front of the eyes of the user 10 to provide information within the user's field of view. The air circulation device 140 can urge air through the housing 110 and over components such as the display 120 to cool such components. The controller 130 can be configured to control operation of one or more components, such as the display 120 and/or air circulation device 140.

The display 120 can transmit light from a physical environment for viewing by the user 10. For example, the display 120 can include optical elements, such as lenses for vision correction. The display 120 can be configured to present information in addition to (e.g., overlaid with) the physical environment viewed by the user. Alternatively, the display 120 can be configured to provide information to the exclusion of the physical environment. In either case, the display 120 can be configured to present graphics to, for example, present a computer-generated reality environment to the user 10.

A physical environment refers to a physical world that people can sense and/or interact with without aid of electronic systems. Physical environments, such as a physical park, include physical articles, such as physical trees, physical buildings, and physical people. People can directly sense and/or interact with the physical environment, such as through sight, touch, hearing, taste, and smell.

In contrast, a computer-generated reality (CGR) environment refers to a wholly or partially simulated environment that people sense and/or interact with via an electronic system. In CGR, a subset of a person's physical motions, or representations thereof, are tracked, and, in response, one or more characteristics of one or more virtual objects simulated in the CGR environment are adjusted in a manner that comports with at least one law of physics. For example, a CGR system may detect a person's head turning and, in response, adjust graphical content and an acoustic field presented to the person in a manner similar to how such views and sounds would change in a physical environment. In some situations, (e.g., for accessibility reasons), adjustments to characteristic(s) of virtual object(s) in a CGR environment may be made in response to representations of physical motions (e.g., vocal commands).

A person may sense and/or interact with a CGR object using any one of their senses, including sight, sound, touch, taste, and smell. For example, a person may sense and/or interact with audio objects that create 3D or spatial audio environment that provides the perception of point audio sources in 3D space. In another example, audio objects may enable audio transparency, which selectively incorporates ambient sounds from the physical environment with or without computer-generated audio. In some CGR environments, a person may sense and/or interact only with audio objects.

Examples of CGR include virtual reality and mixed reality.

A virtual reality (VR) environment refers to a simulated environment that is designed to be based entirely on computer-generated sensory inputs for one or more senses. A VR environment comprises a plurality of virtual objects with which a person may sense and/or interact. For example, computer-generated imagery of trees, buildings, and avatars representing people are examples of virtual objects. A person may sense and/or interact with virtual objects in the VR environment through a simulation of the person's presence within the computer-generated environment, and/or through a simulation of a subset of the person's physical movements within the computer-generated environment.

In contrast to a VR environment, which is designed to be based entirely on computer-generated sensory inputs, a mixed reality (MR) environment refers to a simulated environment that is designed to incorporate sensory inputs from the physical environment, or a representation thereof, in addition to including computer-generated sensory inputs (e.g., virtual objects). On a virtuality continuum, a mixed reality environment is anywhere between, but not including, a wholly physical environment at one end and virtual reality environment at the other end.

In some MR environments, computer-generated sensory inputs may respond to changes in sensory inputs from the physical environment. Also, some electronic systems for presenting an MR environment may track location and/or orientation with respect to the physical environment to enable virtual objects to interact with real objects (that is, physical articles from the physical environment or representations thereof). For example, a system may account for movements so that a virtual tree appears stationery with respect to the physical ground.

Different forms of head-mounted devices that enable a person to sense and/or interact with various CGR environments. Examples include smart glasses, helmets, visors, or goggles. A head-mounted device may have one or more speaker(s) and an integrated opaque display. Alternatively, a head-mounted system may be configured to accept an external opaque display (e.g., a smartphone). The head-mounted device may incorporate one or more imaging sensors to capture images or video of the physical environment, and/or one or more microphones to capture audio of the physical environment. Rather than an opaque display, a head-mounted device may have a transparent or translucent display. The transparent or translucent display may have a medium through which light representative of images is directed to a person's eyes. The display may utilize digital light projection, OLEDs, LEDs, uLEDs, liquid crystal on silicon, laser scanning light source, or any combination of these technologies. The medium may be an optical waveguide, a hologram medium, an optical combiner, an optical reflector, or any combination thereof. In one embodiment, the transparent or translucent display may be configured to become opaque selectively. Projection-based systems may employ retinal projection technology that projects graphical images onto a person's retina. Projection systems also may be configured to project virtual objects into the physical environment, for example, as a hologram or on a physical surface.

Figure 2:
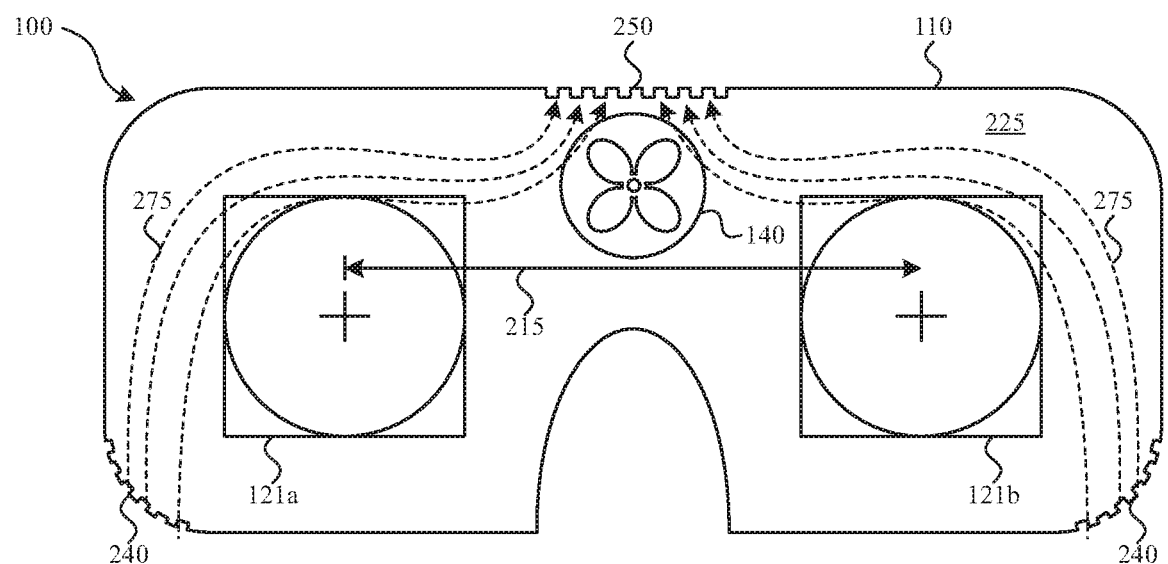
FIG. 2 illustrates a front view of an example of a head-mounted device.

FIG. 2 shows an example of the head-mounted device 100 in front view. As seen in FIG. 2, the display 120 (FIG. 1) can include a first display assembly 121a and a second display assembly 121b, which collectively form a pair of display assemblies corresponding to the two eyes of a user. Each of the display assemblies may include any appropriate combination of electronic and optical elements to present graphical information to the user. For example, each display assembly may include a display layer having an array of electronically controlled pixels that can provide a visual output. The display assembly may further include optical elements, such as lenses, mirrors, etc., and/or a gaze tracking device, to facilitate generation of an enhanced computer generated reality that is responsive to a gaze and/or pose of the user.

The pair of display assemblies can be mounted to the housing 110 and separated by a distance 215. The distance 215 between the pair of display assemblies can designed to correspond to the IPD of a user. The distance 215 can be adjustable to account for different IPDs of different users that may wear the head-mounted device 100. For example, either or both of the display assemblies may be movably mounted to the housing 110 to permit the display assemblies to move or translate laterally to make the distance 215 larger or smaller. Any type of manual or automatic mechanism may be used to permit the distance 215 between the display assemblies to be an adjustable distance. For example, the display assemblies can be mounted to the housing via slidable tracks or guides that permit manual or electronically actuated movement of one or more of the display assemblies to adjust the distance 215.

As seen in FIG. 2, the air circulation device 140 can be positioned in or otherwise mounted to the housing 110 so as to urge a flow of air through an interior space 225 of the housing 110. The housing 110 can include a port that permits fluid communication between the interior space 225 and an environment external to the housing 110, to create a flow path of air in the housing 110. In FIG. 2, the housing is shown with a pair of inlet ports 240 at a bottom side thereof, and an outlet port 250 at a top side thereof, which creates air flow paths 275 extending from the inlet ports 240 to the outlet port 250. Each of the ports can include a vent, screen, hole, porous membrane, and/or other fluidic opening that permits fluid communication thereacross. However, it is contemplated that the housing 110 can generally include any suitable number inlet ports and outlet ports in any suitable locations with respect to the housing to permit a flow of air therein. The air circulation device 140 can be implemented as a fan that is configured to draw air into the inlet port(s) 240 and urge air out of the outlet port 250. However, any suitable number of fans or other air circulation devices can be included to urge movement of air.

The air flow path 275 can extend over or across components such as heat-generating electronic components mounted within the housing. For example, the pair of display assemblies may include heat-generating display layers, and the air circulation device 140 may be configured to generate a flow of air so that the air flow path 275 extends over each of the display assemblies 121a and 121b to cool the heat-generating layers by dissipating heat therefrom. Alternatively, or in combination, the air circulation device 140 may be configured to circulate air over other electronic components, such as integrated circuit chips, other input/output devices, or the like, or across the user's face.

Figure 3:
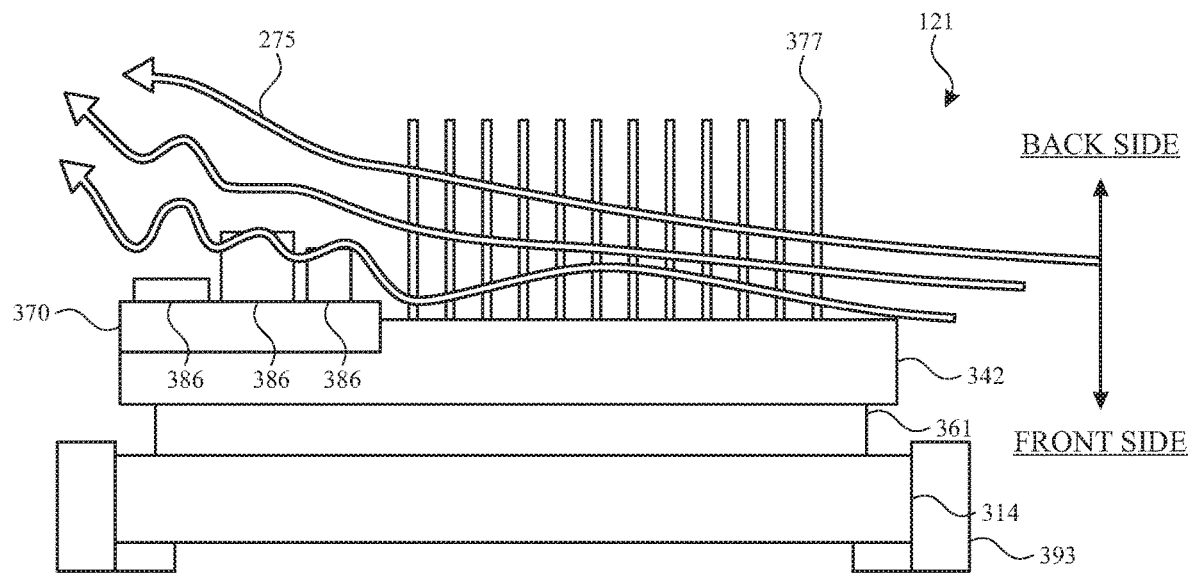
FIG. 3 illustrates a side view of an example of a cooling system.

FIG. 3 shows an example of a display assembly 121, and an air flow path 275 extending over surfaces of the display assembly. The display assembly 121 can be one of a pair of display assemblies like in the example shown in FIG. 2, where each of the first and second display assemblies 121a and 121b can be configured similarly to the display assembly 121. As seen in FIG. 3, the display assembly 121 can include a display layer 314, a heat sink 342, a circuit board 370, one or more components 386 on the circuit board, and an enclosure 393 that serves to enclose and support the foregoing components.

As shown in FIG. 3, the display assembly 121 can have a front side for viewing images and a back side opposite the front side. The display layer 314 can include operative components of the display that form images capable of being viewed by the user from the front side thereof. The display layer 314 can, for example, include any suitable operational display panel having an array of electronically controlled pixels that can provide a visual output, such as an OLED, uLED, or LCD panel. The display assembly 121 can further include other optional components, which can support specialized display functions for providing an immersive head-mounted display. For example, the display assembly 121 can include as gaze-tracking devices or eye trackers (e.g., positioned beside the display layer 314), and/or optics (e.g., positioned in front of the display layer). The optics can be configured to help optically adjust and correctly project the image based content being displayed by the display layer 314 for close up viewing. The optics can include one or more lenses, mirrors, or other optical elements.

In the example shown in FIG. 3, the air flow path 275 passes over the display assembly 121 across a back side thereof, so as to dissipate heat generated from the display layer 314 through the back side. To facilitate dissipation of heat, a heat sink 342 can be positioned behind the back side of the display layer 314. The heat sink 342 can include a plurality of fins 377 positioned in the air flow path 275 so as to increase a surface area of the back surface that is exposed to the flow of air. The heat sink 342 can be thermally coupled to the back side or back surface of the display layer 314 via a thermal interface 361, such as a thermally conductive adhesive or other appropriate thermally conductive material, to enhance heat transfer (e.g., conduction) from the display layer through the heat sink and to the stream of air.

As seen in FIG. 3, the display assembly 121 can further include other structures, such as a circuit board 370 (e.g., a flexible or rigid printed circuit board) on the back side of the display assembly. The circuit board 370 can have one or more components 386 mounted thereon. The components 386 can be, for example, passive or active electronic components surface mounted to the circuit board 370, such as integrated circuit chips, resistors, capacitors, or other structures that can protrude from the surface of the circuit board 370.

The component(s) 386, and/or or other structures of the display assembly, can partially impede or obstruct the free flow of air and have a tendency to increase a turbulence of the air in the flow path. For example, FIG. 3 shows an example in which increased impedance caused by the presence of components 386 causes more turbulent flow, which can degrade the efficiency or user experience as described above.

Figure 4:
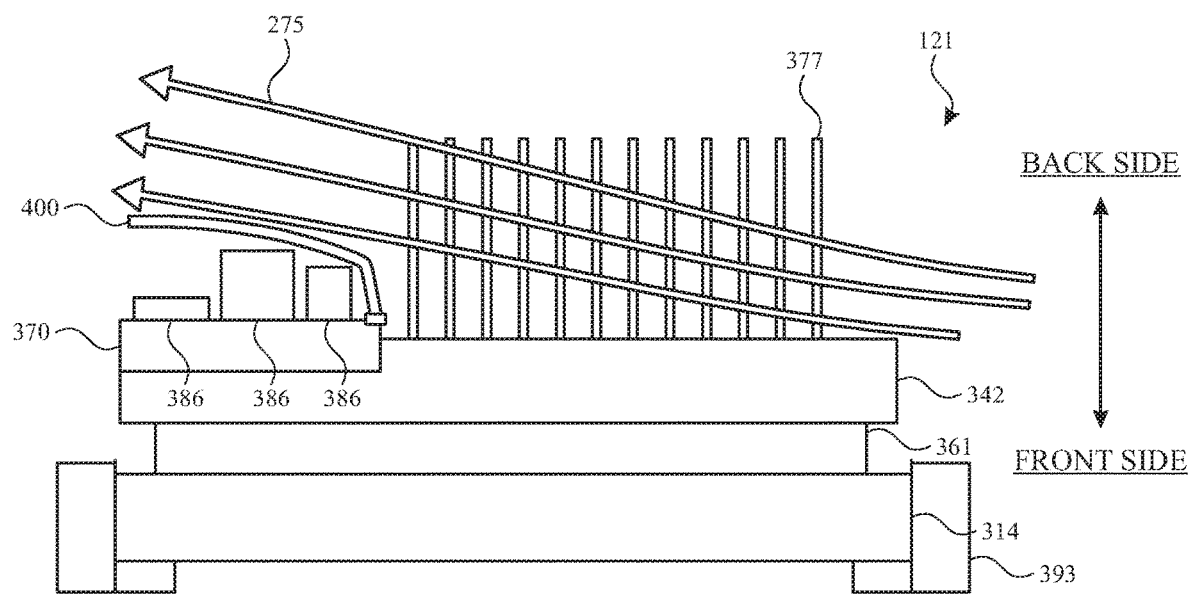
FIG. 4 illustrates a side view of an example of a cooling system having an air deflector.

FIG. 4 shows another example of the display assembly 121. The example shown in FIG. 4 employs a similar structure to FIG. 3, but additionally includes an air deflector 400 positioned in the air flow path 275. The air deflector 400 is a structure that can be mounted to surfaces within the head-mounted device to reduce a turbulence of air passing through the head-mounted device and across the air deflector. The air deflector 400 can have a surface designed to create less turbulent, more laminar flow for air that is incident on the surface. For example, the air deflector 400 can provide a smoother surface or lower angle with respect to an incoming stream of air generated by the air circulation device 140 (e.g., FIG. 2), compared to structures in the head-mounted device that the incoming stream of air would otherwise contact if the air deflector were not present. The air deflector 400 can be a rigid component made of any appropriate material, such as plastic, ceramic, or metal. In some embodiments, the air deflector 400 can be configured as a dedicated wall structure that is mounted to internal structures or inserted into an interior space of the housing solely to affect the properties of the flow of air incident through the interior space, without providing other mechanical or electrical functions.

In the example shown in FIG. 4, the air deflector 400 is mounted to the back side of the display assembly 121. The air deflector 400 is mounted on and attached to the circuit board 370, and extends at least partially over the component(s) 386 so as to at least partially shield the components 386 from the incoming air in the air flow path 275. The air deflector 400 can, for example, be positioned down-stream from the heat sink 342 with respect to the air flow path 275. Compared to the surfaces of the components 386 in the absence of the air deflector 400, the surface of the air deflector that is in the flow path and positioned to receive an incident stream of air can have a smoother surface with fewer bends or steps. Accordingly, the air deflector 400 can be configured to make the air flow path 275 less tortuous.

Although the air deflector 400 is shown mounted to the circuit board 370 on the back side of the display assembly 121, it is contemplated that the air deflector 400 can be mounted in any other desired location within the housing of the head-mounted device in which reduced turbulence is desired. For example, the air deflector 400 can be mounted to the heat-sink or another surface on the back side of the display assembly 121, another non-back side surface of the display assembly, or another internal component within the housing of the head-mounted device.

Figure 5:
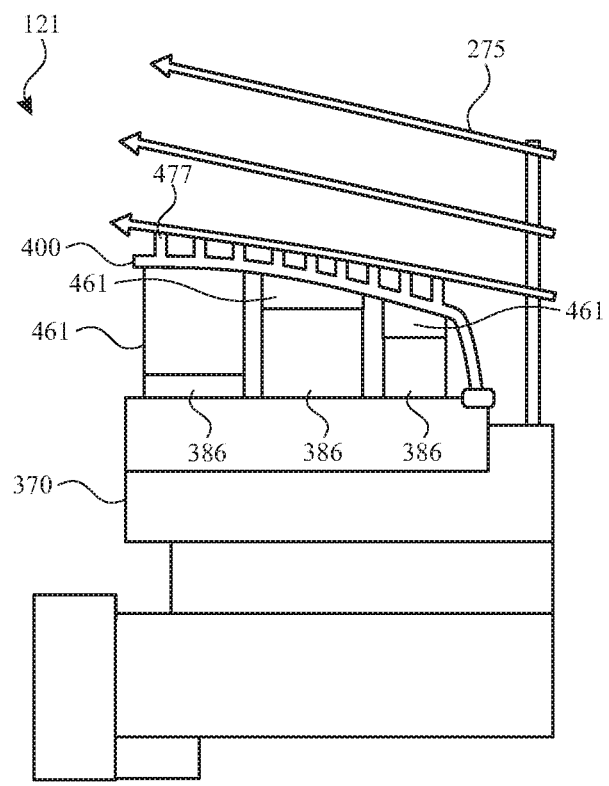
FIG. 5 illustrates a side view of an example of a cooling system having an air deflector.

FIG. 5 illustrates another example of the air deflector 400. In the example shown in FIG. 5, the air deflector 400 is configured similar to the example shown in FIG. 4, but also includes an integral heat sink so that the air deflector 400 can further dissipate heat from the components 386 that are shielded by the air deflector 400, where such components can be heat-generating electronic components. The surface of the air deflector 400 that receives the incident air can include multiple fins 477, which increase a surface area of the surface receiving incident air. To maintain sufficiently laminar flow, the fins 477 can, for example, be configured as longitudinal fins that extend in the direction of air flow, or as a series of aligned pins that are arranged in rows extending along the direction of air flow, among other possible structural arrangements. To facilitate heat transfer, the air deflector 400 can be made of a material having a sufficiently high thermal conductivity, such as copper or aluminum. The air deflector 400 can be coupled to one or several of the components 386. To further enhance the ability of the air deflector 400 to dissipate heat, the air deflector 400 can be thermally coupled to such components via a thermally conductive interface 461, such as a conductive adhesive or other appropriate thermally conductive material.

Figure 6:
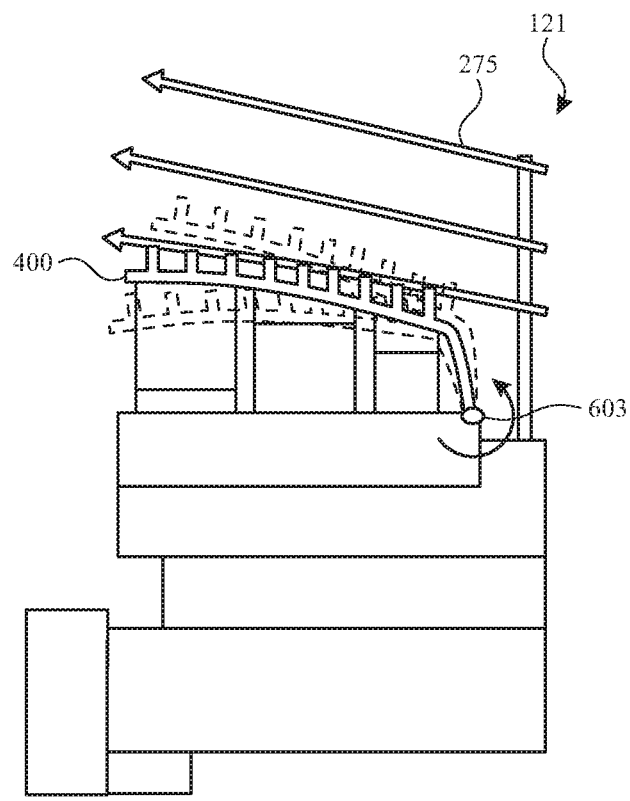
FIG. 6 illustrates a side view of an example of a cooling system having an air deflector.

FIG. 6 illustrates another example of the air deflector 400. The air deflector 400 as shown in FIG. 6 can be configured similar to the examples of FIG. 4 or 5, except that in FIG. 6, the air deflector 400 is movably mounted to a surface (in this case, a surface of the circuit board 370), rather than non-movably or fixedly mounted to the surface like in the previous examples. The movable mounting can permit the air deflector 400 to have an adjustable angle with respect to the incoming stream of air in the air flow path 275. This can be useful to, for example, allow the adjustable angle to be optimized for reduced turbulence in various positions of the air deflector when the position of the air deflector with respect to the flow path or housing is otherwise moved. When the air deflector 400 is mounted to a display assembly that is movable adjust the distance 215 (e.g., FIG. 2), the air deflector 400 can be configured to compensate for its changed position by also moving with respect to the display assembly. For example, the air deflector 400 can be configured to move or rotate relative to the display assembly in response to or otherwise in accordance with movement of the display assembly relative to the housing. The movement of the air deflector 400 can be achieved using, for example, a piezo electric actuator or other actuator, and/or a mechanical linkage that synchronizes movement of the display assembly to rotation of the air deflector 400. In the example shown in FIG. 6, the air deflector 400 is pivotally mounted to the surface of the display assembly 121. The actuator can be configured to rotate the air deflector 400 about pivot point 603, based on movement of the display assembly 121 relative to the housing or based on changes to the distance 215 between the pair of display assemblies, so as to adjust an angle of incidence of air onto the surface of the air deflector 400 to account for a new position of the air deflector with respect to the flow path extending through the housing.

Figure 7:
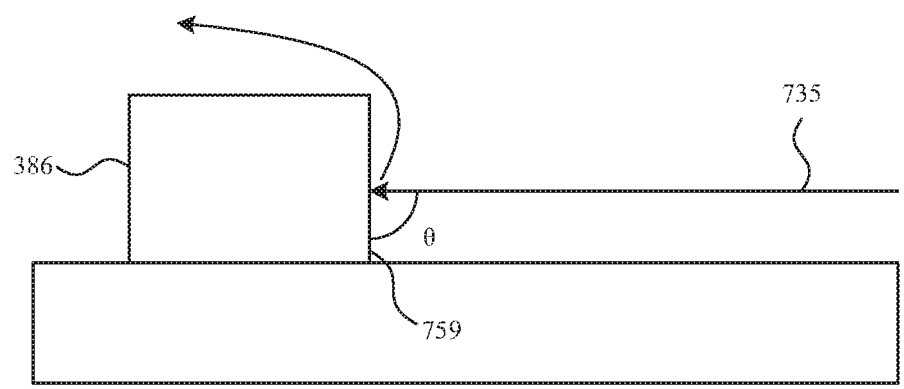
FIG. 7 illustrates a side view of an example of air flow in a cooling system.
Figure 8:
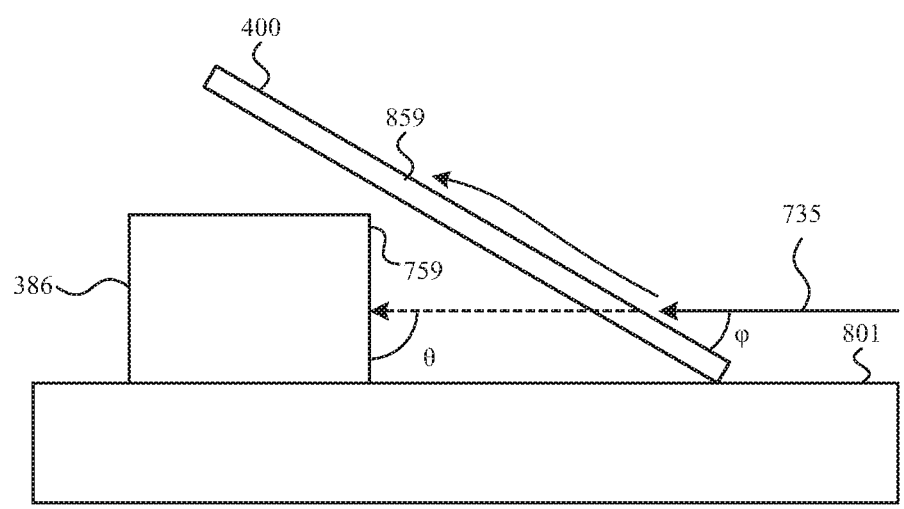
FIG. 8 illustrates a side view of an example of air flow in a cooling system.

FIGS. 7-8 show an example of how an air deflector 400 can reduce turbulence of air in a head-mounted device. FIGS. 7-8 show examples of arrangement without and with an air deflector, respectively.

FIG. 7 shows an arrangement having a component 386 mounted in a flow path and positioned to receive an incoming stream 735 of air in the flow path (e.g., similar to FIG. 3). The component 386 has a surface 759 positioned in the flow path to receive the incoming stream 735 of air thereon. The incoming stream 735 is incident on the surface 759, and forms an angle θ with respect to the surface 759. In this example, the angle θ between the incoming stream 735 and the surface of the component 386 is approximately 90 degrees. Stated another way, the angle of incidence of the incoming stream 735 is approximately zero, wherein the angle of incidence is defined by the angle between the incoming stream and the normal to the incident surface. The large angle between the incoming stream and the incidence surface, or equivalently the low incident angle, causes a dramatic change in the current of air that tends to create turbulent patterns as the incoming stream impinges on the component, and then continues to flow along a tortuous flow path around the component 386.

FIG. 8 shows an identical arrangement to FIG. 7, except that air deflector 400 is mounted in the flow path to deflect, at least partially, the incoming stream 735 of air away from incidence onto the surface 759 of the component 386 (e.g., similar to FIG. 4). The incoming stream 735 is directed towards the surface 759 of the component 386 at the same angle θ as shown in FIG. 7. This is represented in FIG. 8 by the dashed arrow, which illustrates what the path of the incoming stream 735 would be if the air deflector 400 were not present. However, due to the presence of air deflector 400, the incoming stream 735 is wholly or partially deflected away from incidence onto the surface 759 of the component 386. The air deflector 400 has a surface 859 positioned in the flow path to receive the incoming stream 735 of air thereon, and the surface 859 of the air deflector 400 forms an angle φ relative to the incoming stream 735 that is less than the angle θ. Stated another way, the angle of incidence of the incoming stream 735 onto the surface 859 of the air deflector is greater than what the angle of incidence onto the surface 759 of the component 386 would be if the air deflector were not present. As a result of such configuration, the air that further propagates downstream after incidence onto the air deflector 400 is deflected to a less drastic degree compared to if the air deflector 400 were not present and the air were to be incident unobstructed onto the component 386. As a result, the air follows a less tortuous flow path, which can beneficially reduce noise within the device for a given flow velocity and/or improve efficiency of the cooling system.

The air deflector 400 can be configured as any suitable wall structure that forms the desired, turbulence-reducing angle, with respect to the incoming stream 735 of air. Although the wall is shown in FIG. 8 as having a straight geometry, in various embodiments the wall can, for example, have a straight, a bent, or curved geometry. As shown in FIG. 8, the air deflector 400 and the component 386 can both be mounted to the same common surface 801, which can be, for example, any suitable surface of the display assembly. As shown in FIG. 8, the surface 859 (air-receiving surface) of the air deflector can further form an obtuse angle with respect to the surface 801 onto which the air deflector 400 is mounted, which can be useful for reducing turbulence in cases where the incoming stream 735 of air propagates in a direction parallel to the surface 801.

Figure 9:
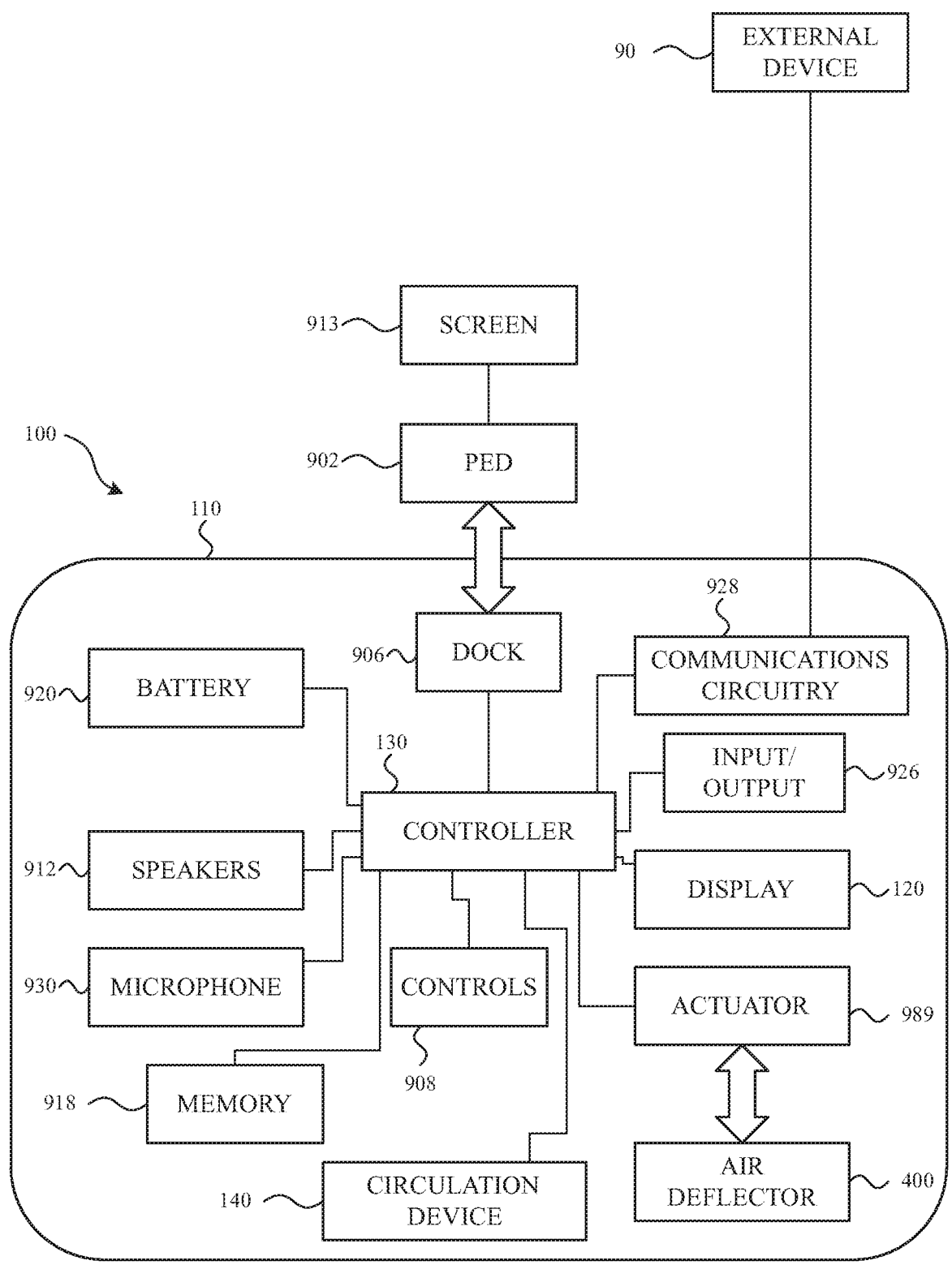
FIG. 9 illustrates a block diagram of an example of a head-mounted device.

Components of the head-mounted device can be operably connected to provide the performance described herein. FIG. 9 shows a simplified block diagram of an example of the head-mounted device 100.

As shown in FIG. 9, the head-mounted device 100 can include a controller 130 with one or more processing units that include or are configured to access a memory 918 having instructions stored thereon. The instructions or computer programs may be configured to perform one or more of the operations or functions described with respect to the head-mounted device 100. The controller 130 can be implemented as any electronic device capable of processing, receiving, or transmitting data or instructions. For example, the controller 130 may include one or more of: a microprocessor, a central processing unit (CPU), an application-specific integrated circuit (ASIC), a digital signal processor (DSP), or combinations of such devices. As described herein, the term "processor" is meant to encompass a single processor or processing unit, multiple processors, multiple processing units, or other suitably configured computing element or elements.

The memory 918 can store electronic data that can be used by the head-mounted device 100. For example, the memory 918 can store electrical data or content such as, for example, audio and video files, documents and applications, device settings and user preferences, timing and control signals or data for the various modules, data structures or databases, and so on. The memory 918 can be configured as any type of memory. By way of example only, the memory 918 can be implemented as random access memory, read-only memory, Flash memory, removable memory, or other types of storage elements, or combinations of such devices.

The head-mounted device 100 can further include a display 120 for displaying visual information for a user. The display 120 can provide visual (e.g., image or video) output, and can include a pair of display assemblies as described herein. The display 120 can be or include an opaque, transparent, and/or translucent display. The display 120 may have a transparent or translucent medium through which light representative of images is directed to a user's eyes. The display 120 may utilize digital light projection, OLEDs, LEDs, uLEDs, liquid crystal on silicon, laser scanning light source, or any combination of these technologies. The medium may be an optical waveguide, a hologram medium, an optical combiner, an optical reflector, or any combination thereof. In some embodiments, the transparent or translucent display may be configured to become opaque selectively. Projection-based systems may employ retinal projection technology that projects graphical images onto a person's retina. Projection systems also may be configured to project virtual objects into the physical environment, for example, as a hologram or on a physical surface. The head-mounted device 100 can include optics configured to help optically adjust and correctly project the image based content being displayed by the display 120 for close up viewing. The optics can include one or more lenses, mirrors, or other optical devices.

In some embodiments, controller 130 can receive user inputs from controls 908 and execute operations in response to the inputs. For example, controller 130 can be configured to receive sound from the microphone 930. In response to receiving the sound, controller 130 can run the voice recognition module to identify voice commands.

Head-mounted device 100 can include a battery 920, which can charge and/or power components of the head-mounted device 100. The battery 920 can also charge and/or power components connected to the head-mounted device 100, such as a portable electronic device 902.

Head-mounted device 100 can include the air circulation device 140 for cooling down components of the head-mounted device 100. The head-mounted device 100 can further include an air deflector 400 disposed in an air flow path and configured to receive a stream of air generated by the air circulation device 140, as further described herein. The air deflector 400 can optionally be movable by an actuator 989, as further described herein. The controller 130 can be configured to operate the actuator 989 to move or rotate the air deflector based on inputs from a user and/or adjustments to assemblies of the display 120.

The head-mounted device 100 can include an input/output component 926, which can include any suitable component for connecting head-mounted device 100 to other devices. Suitable components can include, for example, audio/video jacks, data connectors, or any additional or alternative input/output components.

The head-mounted device 100 can include communications circuitry 928 for communicating with one or more servers or other external devices 90 using any suitable communications protocol. For example, communications circuitry 928 can support Wi-Fi (e.g., a 802.11 protocol), Ethernet, Bluetooth, high frequency systems (e.g., 900 MHz, 2.4 GHz, and 5.6 GHz communication systems), infrared, TCP/IP (e.g., any of the protocols used in each of the TCP/IP layers), HTTP, BitTorrent, FTP, RTP, RTSP, SSH, any other communications protocol, or any combination thereof. Communications circuitry 928 can also include an antenna for transmitting and receiving electromagnetic signals.

The head-mounted device 100 can include audio devices such as a microphone 930 and/or speaker 912. The microphone 930 can be configured to detect sounds from a user and/or environment. The microphone 930 can be operably connected to the controller 130 for detection of sound levels and communication of detections for further processing. The speaker 212 can be configured to emit sounds to a user and/or environment. The speaker 212 can be operably connected to the controller 130 for control of speaker output, including sound levels and/or other sound characteristics.

The head-mounted device 100 can optionally connect to a portable electronic device 902, which can provide certain functions. For the sake of brevity, the portable electronic device 902 will not be described in detail in FIG. 9. It should be appreciated, however, that the portable electronic device 902 may be embodied in a variety of forms including a variety of features, all or some of which can be utilized by the head-mounted device 100 (e.g., input/output, controls, processing, battery, etc.). The portable electronic device 902 can be configured to receive cooling from operation of air circulation device 140. The portable electronic device 902 can provide a handheld form factor (e.g., small portable electronic device which is light weight, fits in a pocket, etc.). Although not limited to these, examples include media players, phones (including smart phones), PDAs, computers, and the like. The portable electronic device 902 may include a screen 913 for presenting the graphical portion of the media to the user. The screen 913 can be utilized as the primary screen of the head-mounted device 100.

The head-mounted device 100 can include a dock 906 operative to receive the portable electronic device 902. The dock 906 can include a connector (e.g., Lightning, USB, FireWire, power, DVI, etc.), which can be plugged into a complementary connector of the portable electronic device 902. The dock 906 may include features for helping to align the connectors during engagement and for physically coupling the portable electronic device 902 to the head-mounted device 100. For example, the dock 906 may define a cavity for placement of the portable electronic device 902. The dock 906 may also include retaining features for securing portable electronic device 902 within the cavity. The connector on the dock 906 can function as a communication interface between the portable electronic device 902 and the head-mounted device 100.

The head-mounted device 100 can include one or more other sensors. Such sensors can be configured to sense substantially any type of characteristic such as, but not limited to, images, pressure, light, touch, force, temperature, position, motion, and so on. For example, the sensor can be a photodetector, a temperature sensor, a light or optical sensor, an atmospheric pressure sensor, a humidity sensor, a magnet, a gyroscope, an accelerometer, a chemical sensor, an ozone sensor, a particulate count sensor, and so on. By further example, the sensor can be a bio-sensor for tracking biometric characteristics, such as health and activity metrics. Other user sensors can perform facial feature detection, facial movement detection, facial recognition, eye tracking, user mood detection, user emotion detection, voice detection, etc. Sensors can include a camera which can capture image based content of the outside world.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

A reference to an element in the singular is not intended to mean one and only one unless specifically so stated, but rather one or more. For example, "a" module may refer to one or more modules. An element proceeded by "a," "an," "the," or "said" does not, without further constraints, preclude the existence of additional same elements.

Headings and subheadings, if any, are used for convenience only and do not limit the invention. The word exemplary is used to mean serving as an example or illustration. To the extent that the term include, have, or the like is used, such term is intended to be inclusive in a manner similar to the term comprise as comprise is interpreted when employed as a transitional word in a claim. Relational terms such as first and second and the like may be used to distinguish one entity or action from another without necessarily requiring or implying any actual such relationship or order between such entities or actions.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A phrase "at least one of" preceding a series of items, with the terms "and" or "or" to separate any of the items, modifies the list as a whole, rather than each member of the list. The phrase "at least one of" does not require selection of at least one item; rather, the phrase allows a meaning that includes at least one of any one of the items, and/or at least one of any combination of the items, and/or at least one of each of the items. By way of example, each of the phrases "at least one of A, B, and C" or "at least one of A, B, or C" refers to only A, only B, or only C; any combination of A, B, and C; and/or at least one of each of A, B, and C.

It is understood that the specific order or hierarchy of steps, operations, or processes disclosed is an illustration of exemplary approaches. Unless explicitly stated otherwise, it is understood that the specific order or hierarchy of steps, operations, or processes may be performed in different order. Some of the steps, operations, or processes may be performed simultaneously. The accompanying method claims, if any, present elements of the various steps, operations or processes in a sample order, and are not meant to be limited to the specific order or hierarchy presented. These may be performed in serial, linearly, in parallel or in different order. It should be understood that the described instructions, operations, and systems can generally be integrated together in a single software/hardware product or packaged into multiple software/hardware products.

In one aspect, a term coupled or the like may refer to being directly coupled. In another aspect, a term coupled or the like may refer to being indirectly coupled.

Terms such as top, bottom, front, rear, side, horizontal, vertical, and the like refer to an arbitrary frame of reference, rather than to the ordinary gravitational frame of reference.

Thus, such a term may extend upwardly, downwardly, diagonally, or horizontally in a gravitational frame of reference.

The disclosure is provided to enable any person skilled in the art to practice the various aspects described herein. In some instances, well-known structures and components are shown in block diagram form in order to avoid obscuring the concepts of the subject technology. The disclosure provides various examples of the subject technology, and the subject technology is not limited to these examples. Various modifications to these aspects will be readily apparent to those skilled in the art, and the principles described herein may be applied to other aspects.

All structural and functional equivalents to the elements of the various aspects described throughout the disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) or § 112, sixth paragraph, unless the element is expressly recited using the phrase "means for" or, in the case of a method claim, the element is recited using the phrase "step for".

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language of the claims and to encompass all legal equivalents. Notwithstanding, none of the claims are intended to embrace subject matter that fails to satisfy the requirements of the applicable patent law, nor should they be interpreted in such a way.

What is claimed is:

1. A head-mounted device comprising:
a housing configured to be worn on a head of a user, the housing comprising an inlet port and an outlet port;
an air circulation device mounted to the housing and configured to produce a flow of air through an air flow path in the housing that extends from the inlet port to the outlet port;
a display assembly mounted to the housing and having a surface in the air flow path of the housing;
an air deflector mounted to the surface of the display assembly and configured to reduce a turbulence of the flow of air through the air flow path;
wherein the display assembly is one of a pair of display assemblies spaced apart from each other by an adjustable distance, and wherein the head-mounted device further comprises an actuator configured to adjust an angle of the air deflector based on changes to the adjustable distance.

2. The head-mounted device of claim 1, wherein the air deflector is movably mounted to the surface of the display assembly.

3. The head-mounted device of claim 1, wherein the air circulation device comprises a fan configured to draw air into the housing through the inlet port and urge air out of the housing through the outlet port.

4. The head-mounted device of claim 1, wherein the display assembly comprises:
a display layer having a front side and a back side;
an optical element positioned in front of the front side of the display layer; and
a heat sink positioned behind the back side of the display layer and in the air flow path of the housing, the heat sink being coupled to the back side of the display layer via a thermally conductive interface.

5. The head-mounted device of claim 4, wherein the display assembly further comprises:
a circuit board positioned behind the back side of the display layer; and
an electronic component mounted to the circuit board,
wherein the air deflector is mounted to the circuit board and extends at least partially over the electronic component.

6. The head-mounted device of claim 1, further comprising:
an electronic component mounted to the surface of the display assembly in the air flow path of the housing,
wherein the air deflector is configured to shield the electronic component from the flow of air.

7. The head-mounted device of claim 6, further comprising:
a thermally conductive material coupled between the electronic component and the air deflector, wherein the thermally conductive material is configured to transfer heat from the electronic component to the flow of air via the air deflector.

8. The head-mounted device of claim 7, further comprising:
a plurality of fins on a surface of the air deflector, the plurality of fins being configured to increase a surface area of the air deflector that is contacted by the flow of air.

9. The head-mounted device of claim 1, wherein the air flow path is configured to extend across a face of the user.

10. A head-mounted device comprising:
a housing;
a component mounted within the housing;
a fan configured to produce a stream of air directed towards a surface of the component at a first angle relative to the surface of the component; and
an air deflector mounted within the housing to deflect the stream of air away from incidence onto the surface of the component, the air deflector having a surface configured to receive the stream of air and oriented at a second angle relative to the stream of air that is less than the first angle.

11. The head-mounted device of claim 10, further comprising:
a display assembly having a surface within the housing, wherein the component is an electronic component mounted to the surface of the display assembly, and wherein the air deflector is mounted to the surface of the display assembly so that the surface of the air deflector forms an obtuse angle with respect to the surface of the display assembly.

12. The head-mounted device of claim 10, wherein the component and the air deflector are mounted to a common surface within the housing, and wherein the surface of the air deflector forms an obtuse angle with respect to the common surface.

13. The head-mounted device of claim 10, further comprising:
a piezo electric actuator coupled to the air deflector and operable to rotate the air deflector to adjust the second angle.

14. The head-mounted device of claim 10, wherein:
the component is an electronic component that generates heat; and
the air deflector includes a heat sink thermally coupled to the electronic component via a thermally conductive material.

15. The head-mounted device of claim 10, wherein the air deflector is a dedicated wall structure.

16. A head-mounted device comprising: a housing having an interior space; a display assembly movably mounted in the interior space; and an air deflector movably attached to a surface of the display assembly;
wherein: the display assembly is one of a pair of display assemblies separated from each other by a distance that is adjustable based on movement of the display assembly; and
the air deflector is configured to move relative to the display assembly based on the movement of the display assembly.

17. The head-mounted device of claim 16, wherein the air deflector is pivotally attached to the surface of the display assembly.

18. The head-mounted device of claim 17, further comprising:
an actuator coupled to the air deflector and configured to rotate the air deflector relative to the display assembly upon movement of the display assembly.

* * * * *